(12) United States Patent
Hashimoto et al.

(10) Patent No.: US 11,955,513 B2
(45) Date of Patent: Apr. 9, 2024

(54) SEMICONDUCTOR DEVICE

(71) Applicants: NISSHINBO MICRO DEVICES INC., Tokyo (JP); University of Yamanashi, Kofu (JP)

(72) Inventors: Makoto Hashimoto, Fujimino (JP); Koji Yano, Kofu (JP); Naohiro Shimizu, Nagoya (JP)

(73) Assignees: NISSHINBO MICRO DEVICES INC., Tokyo (JP); UNIVERSITY OF YAMANASHI, Kofu (JP)

( * ) Notice: Subject to any disclaimer, the term of this patent is extended or adjusted under 35 U.S.C. 154(b) by 207 days.

(21) Appl. No.: 17/766,575

(22) PCT Filed: Nov. 6, 2020

(86) PCT No.: PCT/JP2020/041633
§ 371 (c)(1),
(2) Date: Apr. 5, 2022

(87) PCT Pub. No.: WO2021/090944
PCT Pub. Date: May 14, 2021

(65) Prior Publication Data
US 2023/0282694 A1   Sep. 7, 2023

(30) Foreign Application Priority Data

Nov. 8, 2019   (JP) ................. 2019-203395

(51) Int. Cl.
*H01L 29/74* (2006.01)
*H01L 29/06* (2006.01)
(Continued)

(52) U.S. Cl.
CPC ........ *H01L 29/0634* (2013.01); *H01L 29/732* (2013.01); *H01L 29/7395* (2013.01); *H01L 29/74* (2013.01); *H01L 29/8083* (2013.01)

(58) Field of Classification Search
CPC .............. H01L 29/0634; H01L 29/732; H01L 29/7395; H01L 29/74; H01L 29/8083;
(Continued)

(56) References Cited

U.S. PATENT DOCUMENTS 8,987,818 B1 * 3/2015 McGregor .......... H01L 29/0653
257/341
RE45,449 E * 4/2015 Zundel ................ H01L 29/0634
257/329
(Continued)

FOREIGN PATENT DOCUMENTS

JP   2001-196602 A   7/2001
JP   2004-063507 A   2/2004
JP   2004-079631 A   3/2004

OTHER PUBLICATIONS

Jan. 19, 2021 International Search Report issued in International Patent Application No. PCT/JP2020/041633.
(Continued)

*Primary Examiner* — Sheikh Maruf
(74) *Attorney, Agent, or Firm* — Oliff PLC

(57) ABSTRACT

A semiconductor device has a super junction structure and includes a first semiconductor layer of the second conductive type disposed on the first column region and the second column region, a second semiconductor layer of the first conductive type disposed on the first semiconductor layer, a first semiconductor region of the first conductive type that is electrically connected to the first electrode and is disposed in a surface layer portion of the second semiconductor layer to be separated from the first semiconductor layer, and a second semiconductor region of the second conductive type that is electrically connected to the second electrode and that is disposed at least in the surface layer portion of the second
(Continued)

semiconductor layer to be separated from the first semiconductor region and is electrically connected to the first semiconductor layer.

5 Claims, 11 Drawing Sheets

(51) Int. Cl.
*H01L 29/732* (2006.01)
*H01L 29/739* (2006.01)
*H01L 29/808* (2006.01)

(58) Field of Classification Search
CPC ............ H01L 29/0692; H01L 29/0821; H01L 29/1004; H01L 29/72; H01L 29/808; H01L 29/812
USPC .......................................................... 257/341
See application file for complete search history.

(56) References Cited

U.S. PATENT DOCUMENTS

| | | | |
|---|---|---|---|
| 2005/0230715 A1 | 10/2005 | Hoshino et al. | |
| 2007/0278540 A1* | 12/2007 | Hoshino | H01L 29/0634 257/E29.313 |
| 2009/0079002 A1* | 3/2009 | Lee | H01L 21/26513 257/E23.001 |
| 2013/0049114 A1* | 2/2013 | Wang | H01L 21/0334 257/E29.256 |
| 2013/0082323 A1* | 4/2013 | Xiao | H01L 29/7813 257/329 |
| 2013/0146967 A1* | 6/2013 | Peake | H01L 29/66734 438/270 |
| 2013/0181328 A1* | 7/2013 | Cao | H01L 29/7395 257/618 |
| 2014/0084361 A1* | 3/2014 | Saito | H01L 29/66712 257/329 |
| 2014/0191309 A1* | 7/2014 | Eguchi | H01L 29/0878 257/329 |
| 2014/0327068 A1* | 11/2014 | Gamerith | H01L 29/7802 257/329 |
| 2015/0076589 A1* | 3/2015 | Sato | H01L 29/7802 257/329 |
| 2015/0287820 A1* | 10/2015 | Mallikarjunaswamy | H01L 29/0634 257/341 |

OTHER PUBLICATIONS

Theolier, L. et al., "BJT Application Expansion by Insertion of Superjunction," 2010 22nd International Symposium on Power Semiconductor Devices & IC's (ISPSD), 2010, pp. 157-160.

Yano, K. et al., "First Demonstration of Si Superjunction BJT with Ultra-High Current Gain and low ON-resistance," 2020 32nd International Symposium on Power Semiconductor Devices and ICs (ISPSD), Aug. 18, 2020, pp. 451-454.

Apr. 27, 2022 Office Action issued in Taiwanese Patent Application No. 109138863.

* cited by examiner

Vgs=0.76V, Vds=0.5V

SEMICONDUCTOR DEVICE

CROSS-REFERENCE TO RELATED APPLICATIONS

This application is national stage application of International Application No. PCT/JP2020/041633, filed on Nov. 6, 2020, which designates the United States, incorporated herein by reference, and which claims the benefit of priority from Japanese Application No. 2019-203395, filed on Nov. 8, 2019, the entire contents of which are incorporated herein by reference.

FIELD

Embodiments described herein relate generally to a semiconductor device.

BACKGROUND ART

There are power semiconductor devices applied to a high voltage and a large current. As a power semiconductor device, a semiconductor device is known that uses a phenomenon in which a drift layer or a collector layer has low resistance by a conductivity modulation effect in an on state (e.g., L. Theolier, C. Benboujema, A. Schellmanns, N. Batut, Y. Raingeaud, J. B. Ouoirin, "BJT Application Expansion by Insertion of Superjunction", 22nd ISPSD, pp. 157-160, 2010).

Examples of the semiconductor device using the conductivity modulation effect include a thyristor, an insulated gate bipolar transistor (IGBT), and a bipolar junction transistor (BJT).

The thyristor and the IGBT among these examples can conduct a large amount of current in a large current region. In contrast, the BJT can conduct a large amount of current in a region equal to or lower than a diffusion potential.

SUMMARY OF THE INVENTION

Problem to be Solved by the Invention

However, although the BJT excels in current characteristics at a rising edge, the BJT has disadvantages of low withstand voltage between a base and an emitter and easiness of breaking when a large current transiently flows as in an event of turn-off.

SUMMARY

An object of the embodiments of the present invention is to provide a semiconductor device that has high withstand voltage characteristics and is capable of suppressing breakage due to a large transient current.

A semiconductor device according to an embodiment includes a super junction structure including a first column region of a first conductive type and a second column region of a second conductive type disposed adjacent to the first column region. The semiconductor device further includes: first and second electrodes that are disposed on one side of the super junction structure and that constitute a transistor and are configured to control a current flowing in the transistor; and a third electrode that is disposed on an opposite side of the first and the second electrodes with the super junction structure interposed therebetween and that constitutes the transistor. The semiconductor device includes: a first semiconductor layer of the second conductive type disposed on the first column region and the second column region; a second semiconductor layer of the first conductive type disposed on the first semiconductor layer; a first semiconductor region of the first conductive type that is a semiconductor region electrically connected to the first electrode, the first semiconductor region being disposed in a surface layer portion of the second semiconductor layer to be separated from the first semiconductor layer; and a second semiconductor region of the second conductive type that is a semiconductor region electrically connected to the second electrode, the second semiconductor region being disposed at least in the surface layer portion of the second semiconductor layer to be separated from the first semiconductor region and being electrically connected to the first semiconductor layer.

DETAILED DESCRIPTION

The present invention will be described in detail below with reference to the drawings. The present invention is not limited to the following embodiments. Components in the following embodiments include those easily conceivable by a person skilled in the art or those substantially identical thereto.

[First Embodiment]

A first embodiment will be described in detail below with reference to the drawings.

(Configuration Example of Semiconductor Device)

Figure 1:
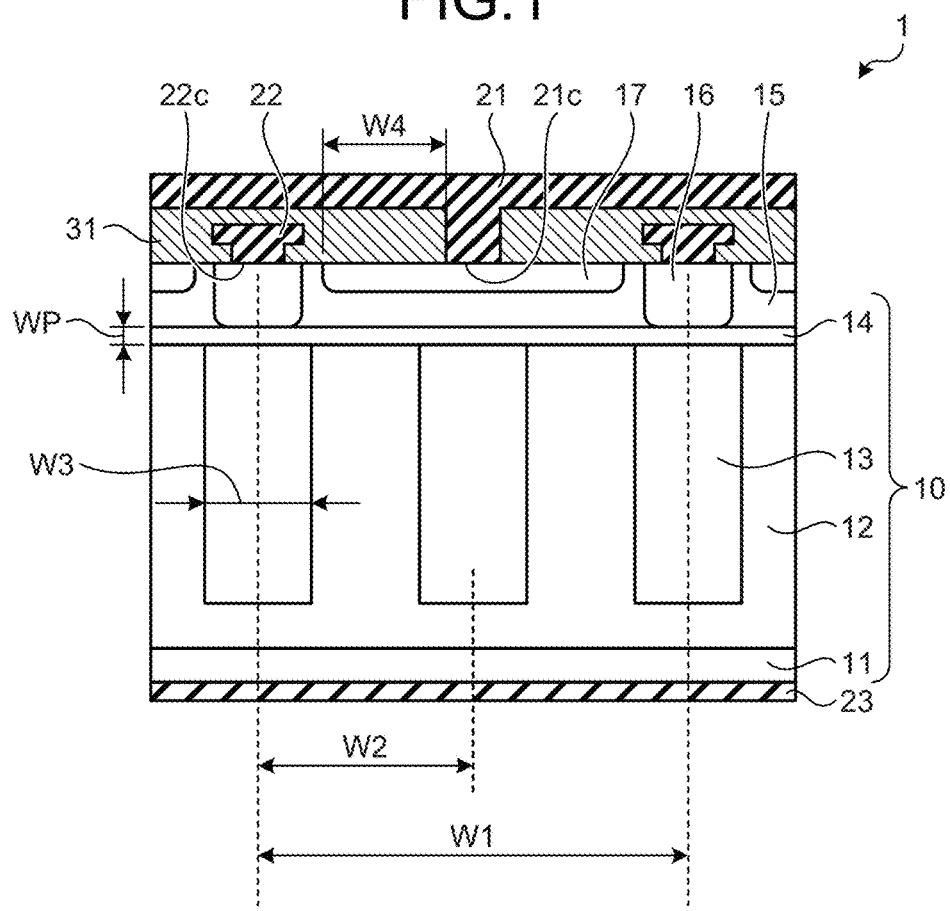
FIG. 1 is a sectional view illustrating an example of a configuration of a semiconductor device according to a first embodiment.

FIG. 1 is a sectional view illustrating an example of a configuration of a semiconductor device 1 according to the first embodiment. As illustrated in FIG. 1, the semiconductor device 1 of the first embodiment includes a semiconductor substrate 10 including an n-type semiconductor layer 11, an n-type column region 12, a p-type column region 13, and a p-type channel layer 14, an n-type semiconductor layer 15, a p-type gate region 16, an n-type source region 17, a source electrode 21, a gate electrode 22, and a drain electrode 23. The names of, for example, the source electrode 21, the gate electrode 22, and the drain electrode 23 are merely for convenience, and do not necessarily identify functions thereof.

The semiconductor substrate 10 includes, at a bottom layer thereof, the n-type semiconductor layer 11 serving as an n-type semiconductor layer. The n-type column region 12 serving as a first column region that is an n-type semiconductor region and the p-type column region 13 serving as a second column region that is a p-type semiconductor region are alternately arranged so as to be adjacent to each other on/above the n-type semiconductor layer 11. The n-type column region 12 and the p-type column region 13 form a super junction structure. The p-type channel layer 14 serving as a first semiconductor layer that is a p-type semiconductor layer is disposed on the n-type column region 12 and the p-type column region 13.

The n-type semiconductor layer 15 serving as a second semiconductor layer that is an n-type semiconductor layer formed by, for example, epitaxial growth is disposed on the p-type channel layer 14. The p-type gate region 16 serving as a second semiconductor region that is a p-type diffusion region reaching the p-type channel layer 14 from a surface layer portion of the n-type semiconductor layer 15 is disposed in the n-type semiconductor layer 15. The n-type source region 17 serving as a first semiconductor region that is an n-type diffusion region is disposed in a surface layer portion of the n-type semiconductor layer 15 sandwiched between the p-type gate regions 16. The n-type source region 17 is isolated from the p-type channel layer 14 and the p-type gate region 16 by the n-type semiconductor layer 15. In this case, a distance between the n-type source region 17 and the p-type gate region 16 is preferably set to, for example, 3 μm or larger.

The total amount of impurities in the n-type column region 12 is set to substantially the same as the total amount of impurities in the p-type column region 13. The impurity concentration of the n-type semiconductor layer 15 is lower than the impurity concentration of the n-type column region 12, and is set to, for example, $1 \times 10^{15}$ cm$^{-3}$ or lower. The impurity concentration of the p-type gate region 16 is set higher than the impurity concentration of the p-type channel layer 14.

The gate electrode 22 serving as a second electrode is disposed above the p-type gate region 16, and is connected to the p-type gate region 16 via a gate contact 22c. The source electrode 21 serving as a first electrode is disposed so as to cover the whole, and is connected to the n-type source region 17 via a source contact 21c. An insulating layer 31 is disposed between the gate electrode 22 and the source electrode 21, and thus, the gate electrode 22 is insulated from the source electrode 21. The drain electrode 23 serving as a third electrode is disposed so as to cover the entire lower surface on the n-type semiconductor layer 11 side of the semiconductor substrate 10.

The following describes an operation of the semiconductor device 1 configured as described above.

To turn on the semiconductor device 1, a positive voltage is applied to the drain electrode 23 and a positive voltage is applied to the gate electrode 22 such that the drain side has a positive potential with respect to the source side. As a result, holes are injected from the p-type gate region 16 into the n-type source region 17.

The holes are also injected from the p-type gate region 16 into the p-type channel layer 14. The holes injected into the p-type channel layer 14 flow through the p-type channel layer 14 into the p-type column region 13 and the n-type column region 12. As a result, at least an upper structure of the super junction structure is reduced in resistance by conductivity modulation.

Electrons are injected from the n-type source region 17 into the p-type channel layer 14. The electrons injected into the p-type channel layer 14 flow through the p-type channel layer 14 into the p-type column region 13 and the n-type column region 12 that have been reduced in resistance, and finally reach the drain electrode 23. As a result, a current flows between the source electrode 21 and the drain electrode 23.

When the semiconductor device 1 is in an off state, no gate voltage is applied to the gate electrode 22. In this state, when the positive voltage is applied to the drain electrode 23, a depletion layer spreads on both sides of the p-type column region 13 and the n-type column region 12 from each of a plurality of pn junctions between the p-type column regions 13 and the n-type column regions 12. As a result, the super junction structure is depleted at a low electric field strength, and thus, the semiconductor device 1 can have a high withstand voltage.

In the semiconductor device 1 of the first embodiment, the n-type semiconductor layer 15 having a low impurity concentration is disposed between the n-type source region 17 and the p-type channel layer 14. The n-type source region 17 is also separated from the p-type gate region 16 by the n-type semiconductor layer 15. As described above, the impurity concentration of the n-type semiconductor layer 15 is set to, for example, $1 \times 10^{15}$ cm$^{-1}$ or lower, and the distance between the n-type source region 17 and the p-type gate region 16 is set to, for example, 3 μm or larger. As a result, the withstand voltage between the n-type source region 17 and the p-type gate region 16 will be, for example, 50 V or higher.

(Transistor Pitch)

Subsequently, a preferable configuration of the semiconductor device 1 of the first embodiment will be described using FIG. 1.

In the semiconductor device 1 of the first embodiment, as a pitch W2 of the super junction structure decreases, the impurity concentration of the n-type column region 12 can increase, and accordingly, an on-resistance can decrease.

A transistor pitch W1 depends on a width of the n-type source region 17, and the width of the n-type source region 17 has an optimal value. This is because, as the width of the n-type source region 17 increases, the number of the electrons injected from the n-type source region 17 into the p-type channel layer 14 increases while a moving distance of the holes in the n-type source region 17 and the p-type channel layer 14 becomes longer, so that the source resistance and the channel resistance increase.

Therefore, in the semiconductor device 1, after fixing the pitch W2 of the super junction structure, it is preferable to set the width of the n-type source region 17 so as to reduce the on-resistance of the semiconductor device 1 as much as possible and set the transistor pitch W1 based on the width of the n-type source region 17.

(Thickness of Channel Layer)

Figure 2:
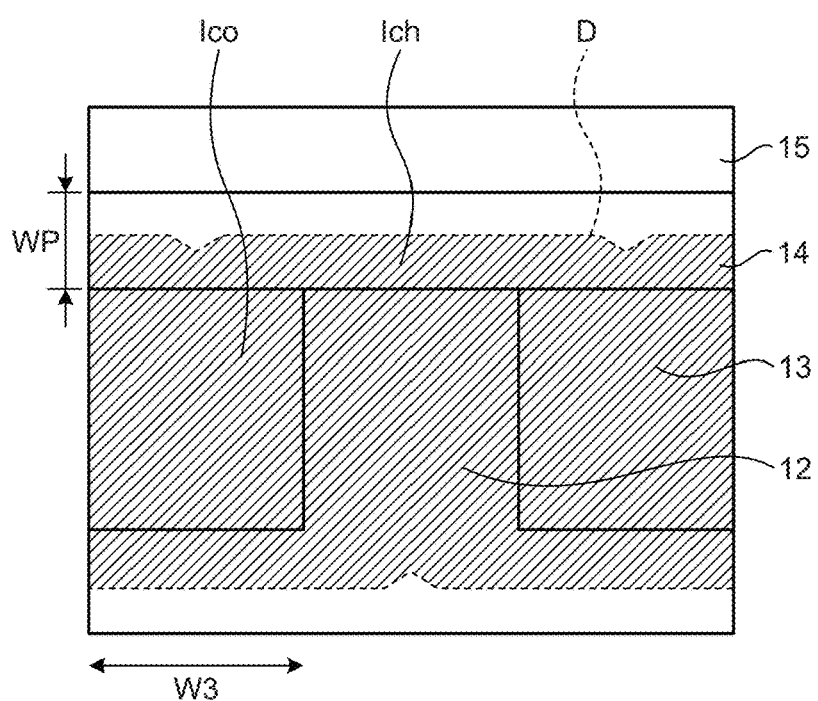
FIG. 2 is a diagram schematically illustrating a state of a depletion layer when the semiconductor device according to the first embodiment is in an off state.

Subsequently, the preferable configuration of the semiconductor device 1 of the first embodiment will be described using FIGS. 1 and 2. FIG. 2 is a diagram schematically illustrating a state of a depletion layer D when the semiconductor device 1 according to the first embodiment is in the off state.

In the on state, a transport efficiency of majority carriers (electrons) injected from the n-type source region 17 into the p-type channel layer 14 in the p-type channel layer 14 is closer to one as a thickness WP of the p-type channel layer 14 decreases, and thus, the current drive capability of the semiconductor device 1 improves.

However, as the thickness WP of the p-type channel layer 14 decreases, the p-type channel layer 14 is more easily completely depleted in the off state.

Therefore, an impurity concentration Ich of the p-type channel layer 14 is preferably increased while reducing the thickness WP of the p-type channel layer 14 as much as possible. As a guide, the thickness WP of the p-type channel layer 14 only needs to be smaller than, for example, a width W3 of the p-type column region 13, and the impurity concentration Ich only needs to be higher than, for example, an impurity concentration Ico of the p-type column region 13.

As illustrated in FIG. 2, when the above-described configuration is employed, the depletion layer D of the super junction structure is kept from being connected between the source and drain in the off state, and the high withstand voltage can be maintained.

(Distance Between Source Region and Source Contact)

Subsequently, the preferable configuration of the semiconductor device 1 of the first embodiment will be described using FIG. 1.

In the semiconductor device 1 of the first embodiment, a distance W4 from an edge of the n-type source region 17 to an edge of the source contact 21c is preferably equal to or larger than a predetermined distance. This configuration can reduce a current caused by minority carriers (holes) injected from the p-type gate region 16 into the n-type source region 17, and thus, can reduce the gate current to increase the current amplification factor of the semiconductor device 1. Herein, the current amplification factor of the semiconductor device 1 refers to drain current/gate current.

The current value caused by the holes injected from the p-type gate region 16 into the n-type source region 17 depends on a diffusion length of the holes in the n-type source region 17. Therefore, the distance W4 from the edge of the n-type source region 17 to the edge of the source contact 21c is preferably equal to or larger than the diffusion length of the holes in the n-type source region 17, and the distance W4 is more preferably equal to or larger than three times the diffusion length of the holes.

(Comparative Example)

Next, a semiconductor device of a comparative example will be described below using FIG. 3, and effects of the semiconductor device 1 of the first embodiment will be described as compared with the semiconductor device of the comparative example.

Figure 3:
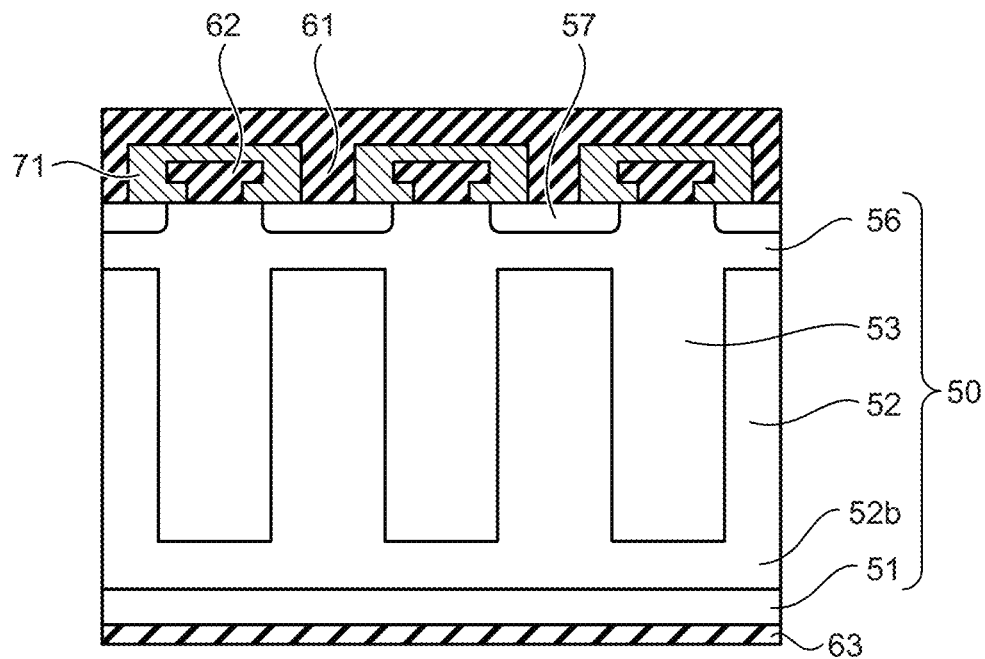
FIG. 3 is a sectional view illustrating a configuration of a semiconductor device according to a comparative example.

FIG. 3 is a sectional view illustrating a configuration of the semiconductor device according to the comparative example. As illustrated in FIG. 3, the semiconductor device of the comparative example is configured as a super-junction bipolar transistor (SJ-BJT) using the super junction structure in a collector region.

A semiconductor substrate 50 included in the semiconductor device of the comparative example includes an n-type collector layer 51, an n-type buffer layer 52b, an n-type column region 52, a p-type column region 53, and a p-type base layer 56 in this order from the bottom layer. An n-type emitter region 57 is selectively formed in a surface layer portion of the p-type base layer 56 on the n-type column region 52. An emitter electrode 61 connected to the n-type emitter region 57 is disposed above the n-type emitter region 57. A base electrode 62 connected to the p-type base layer 56 is disposed above the p-type base layer 56. The emitter electrode 61 is isolated from the base electrode 62 by an insulating layer 71. A collector electrode 63 is disposed on a lower surface on the n-type collector layer 51 side of the semiconductor substrate 50.

When the semiconductor device of the comparative example is in the off state, the depletion layer spreads on both sides of the p-type column region 53 and the n-type column region 52 from each of a plurality of pn junctions between the p-type column regions 53 and the n-type column regions 52, and the super junction structure of the p-type column region 53 and the n-type column region 52 is depleted at a low electric field strength, so that the withstand voltage is increased. In the off state, the super junction structure maintains a reverse bias. Therefore, the depletion layer only slightly spreads to the p-type base layer 56, and the p-type base layer 56 can be made thin. Therefore, in the on state, the injection efficiency of electrons from the emitter region to the collector region can be increased.

To turn on the semiconductor device of the comparative example, a positive voltage is applied to the base electrode 62. As a result, holes are injected from the p-type base layer 56 into the n-type emitter region 57, and a collector current flows between the collector and the emitter. In the semiconductor device of the comparative example serving as the SJ-BJT, the impurity concentration of the n-type column region 52 can be made higher than the impurity concentration of the collector layer of a conventional high withstand voltage vertical bipolar transistor. Therefore, in a region of a high collector current density, the current amplification factor can be kept from being reduced by collector resistance.

Some of the holes from the p-type base layer 56 flows into the p-type column region 53 and the n-type column region 52, and the super junction structure and the n-type buffer layer 52b are reduced in resistance by the conductivity modulation. Therefore, in the semiconductor device of the comparative example, a voltage equal to or higher than a diffusion potential difference need not be applied as in the case of, for example, the IGBT, and the collector current flows along with the application of the collector voltage.

As described above, the semiconductor device of the comparative example is configured as the SJ-BJT, and excels in current rising characteristics. However, in the semiconductor device of the comparative example, the high-concentration p-type base layer 56 is in contact with the high-concentration n-type emitter region 57, and the withstand voltage between the base and the emitter is as low as approximately 10 V to 20 V. In addition, in the semiconductor device of the comparative example, when a large current transiently flows as in the event of turn-off, the p-type base layer 56 may be destroyed.

According to the semiconductor device 1 of the first embodiment, the n-type source region 17 is arranged on the surface layer portion of the n-type semiconductor layer 15 so as to be separated from the p-type channel layer 14. In addition, the p-type gate region 16 is separated from the n-type source region 17, and reaches the p-type channel layer 14 from the surface layer portion of the n-type semiconductor layer 15. As a result, a reverse withstand voltage between the gate and the source increases to make the destruction difficult to occur.

According to the semiconductor device 1 of the first embodiment, the p-type gate region 16 is in contact with the p-type channel layer 14. As a result, the resistance of a conducting path of the large current transiently generated in the event of the turn-off can be reduced, and the fracture toughness can be increased.

According to the semiconductor device 1 of the first embodiment, after fixing the pitch W2 of the super junction structure, the transistor pitch W1 is set based on the width of the n-type source region 17.

For example, in the semiconductor device of the comparative example, the n-type emitter region 57 is selectively formed above the n-type column region 52; the p-type base layer 56 is formed above the p-type column region 53; and the base electrode 62 is formed above the p-type base layer 56. That is, in the case of the SJ-BJT such as in the semiconductor device of the comparative example, the transistor pitch is the same as the pitch of the super junction.

In contrast, in the semiconductor device 1 of the first embodiment, the width of the n-type source region 17 can be optimized regardless of the pitch W2 of the super junction structure, and therefore, the on-resistance of the semiconductor device 1 can be suppressed.

According to the semiconductor device 1 of the first embodiment, the thickness WP of the p-type channel layer 14 is smaller than the width W3 of the p-type column region 13, and the impurity concentration Ich is higher than the impurity concentration Ico of the p-type column region 13. As a result, in the on state, the transport efficiency of the electrons injected from the n-type source region 17 into the p-type channel layer 14 can be made close to one. In addition, in the off state, the p-type channel layer 14 is kept from being fully depleted to suppress the occurrence of punch-through between the drain and the source, and the high withstand voltage can be maintained.

According to the semiconductor device 1 of the first embodiment, the distance W4 from the edge of the n-type source region 17 to the edge of the source contact 21*c* is three times or more the diffusion length of the holes. As a result, the holes injected from the p-type gate region 16 to the n-type source region 17 can be reduced to increase the current amplification factor.

[Second Embodiment]

Next, a semiconductor device 2 of a second embodiment will be described below using FIG. 4. The semiconductor device 2 of the second embodiment differs from the semiconductor device of the above-described first embodiment in that a p-type gate region 18 is not in physical contact with the p-type channel layer 14.

Figure 4:
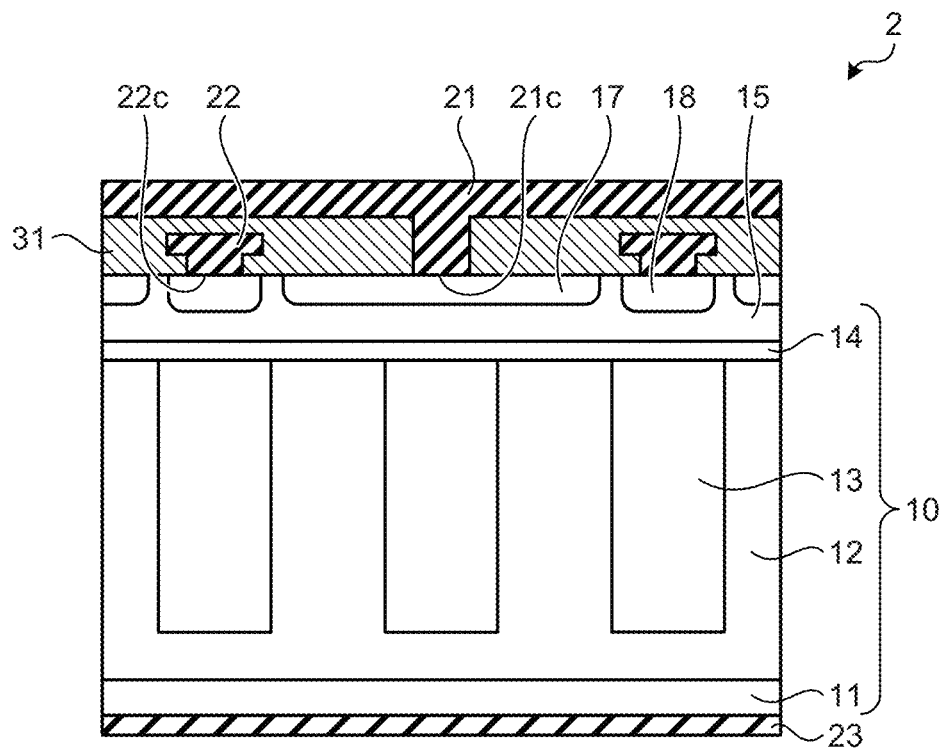
FIG. 4 is a sectional view illustrating an example of a configuration of a semiconductor device according to a second embodiment.

FIG. 4 is a sectional view illustrating an example of a configuration of the semiconductor device 2 according to the second embodiment. In FIG. 4, the same components as those of the above-described first embodiment are denoted by the same reference numerals, and will not be described.

As illustrated in FIG. 4, in the semiconductor device 2 of the second embodiment, the p-type gate region 18 does not reach the p-type channel layer 14. However, the p-type gate region 18 is electrostatically connected to the p-type channel layer 14. A pnp junction structure is formed between the p-type gate region 18 and the p-type channel layer 14. The state where the p-type gate region 18 is electrostatically connected to the p-type channel layer 14 refers to a state where the holes can be injected from the p-type gate region 18 into the p-type channel layer 14 even though the n-type semiconductor layer 15 is interposed therebetween in this manner. That is, the gradient of the impurity concentration in the pnp junction structure between the p-type gate region 18 and the p-type channel layer 14 is adjusted to enable the operation as the semiconductor device 2 even though the p-type gate region 18 is away from the p-type channel layer 14.

Accordingly, the on/off operations and the on/off characteristics of the semiconductor device 2 of the second embodiment are the same as those of the semiconductor device 1 of the first embodiment described above.

However, in the semiconductor device 2, since the p-type gate region 18 is not diffused to an extent of reaching the p-type channel layer 14, the manufacturing process of the semiconductor device 2 does not require heat treatment at a high temperature for a long time. As a result, interdiffusion of impurities between the n-type column region 12 and the p-type column region 13 is suppressed, and the effective amount of impurities in the n-type column region 12 is maintained. The effective amount of impurities in the n-type column region 12 contributes to the characteristics in the on state.

According to the semiconductor device 2 of the second embodiment, the p-type gate region 18 and the p-type channel layer 14 are not in physical contact with each other, but are electrically connected to each other. As a result, the heat treatment at a high temperature for a long time is not required, and thus, reduction in performance of the semiconductor device 2 can be suppressed.

[Third Embodiment]

Next, a semiconductor device 3 of a third embodiment will be described below using FIGS. 5A and 5B. The semiconductor device 3 of the third embodiment differs from the semiconductor devices of the first and the second embodiments described above in that it includes a p-type embedded gate region 19.

Figure 5A:
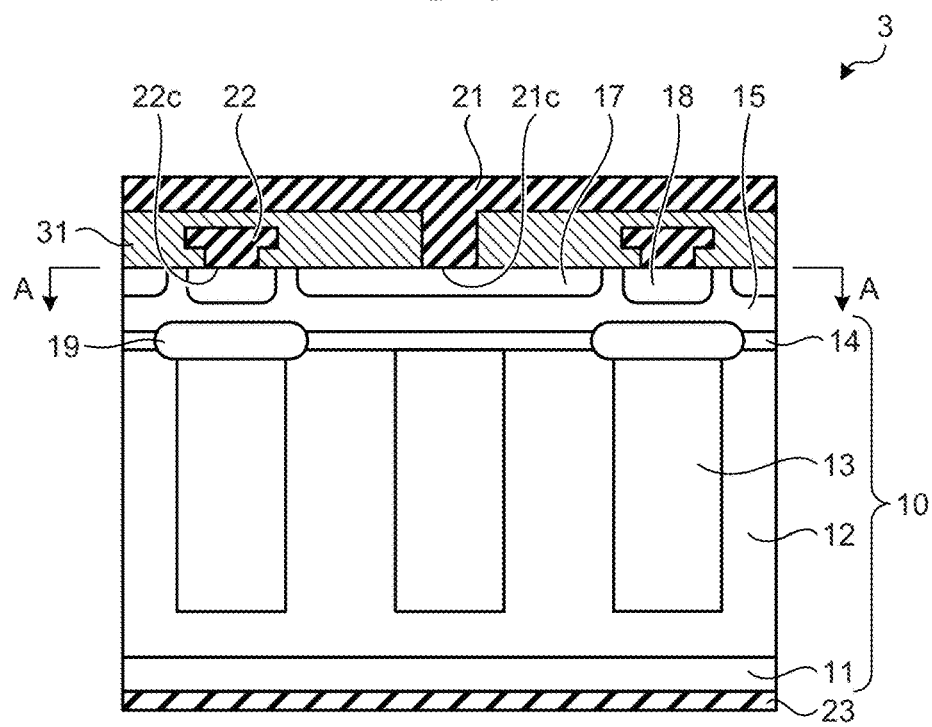
FIGS. 5A and 5B depict views illustrating an example of a configuration of a semiconductor device according to a third embodiment.
Figure 5B:
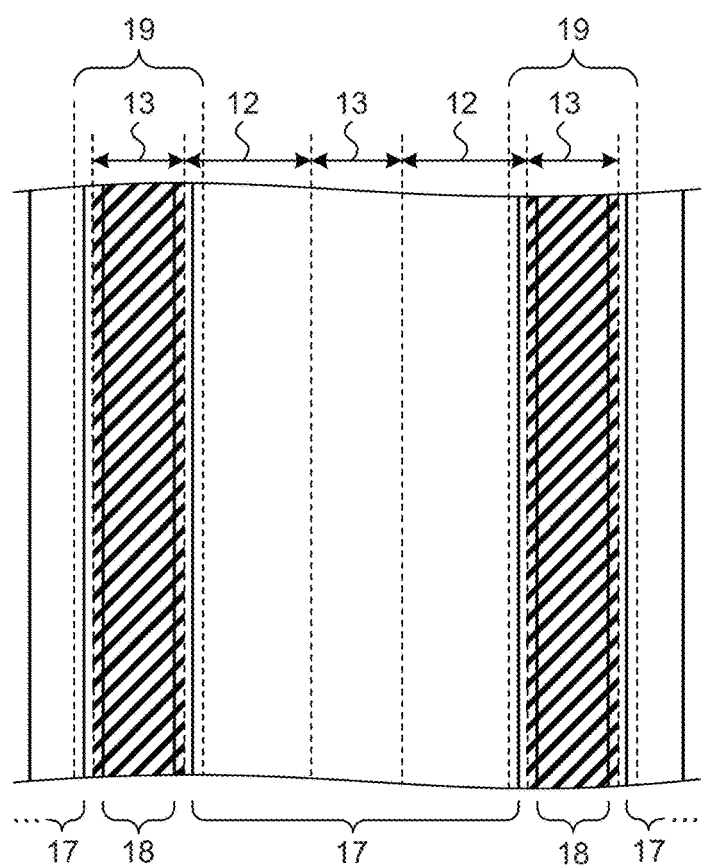

FIGS. 5A and 5B depict views illustrating an example of a configuration of the semiconductor device 3 according to the third embodiment. FIG. 5A is a vertical sectional view of the semiconductor device 3. FIG. 5B is a horizontal sectional view of the semiconductor device 3 taken along line A-A of FIG. 5A. In FIGS. 5A and 5B, the same components as those of the first or the second embodiment described above are denoted by the same reference numerals, and will not be described.

As illustrated in FIG. 5A, the semiconductor device 3 of the third embodiment includes the p-type embedded gate region 19 serving as a third semiconductor region that is a p-type diffusion region in the p-type channel layer 14 below the p-type gate region 18. However, the semiconductor device 3 may include the p-type gate region 16 that reaches the p-type embedded gate region 19 as in the first embodiment described above.

The p-type embedded gate region 19 is formed by, for example, forming the p-type channel layer 14 on the semiconductor substrate 10 and then further diffusing p-type impurities in a predetermined region at a high concentration. After the n-type semiconductor layer 15 serving as an epitaxial layer is formed, a portion of the p-type impurities diffused at a high concentration is also diffused in the n-type semiconductor layer 15, and is formed as the p-type embedded gate region 19 thicker than the p-type channel layer 14.

A region in which the p-type embedded gate region 19 is disposed corresponds to a region in which the p-type gate region 18 is electrostatically connected to the p-type channel layer 14, and serves as, for example, a conducting path of the large current transiently generated in the event of the turn-off. The p-type embedded gate region 19 including a high concentration of the p-type impurities reduces the resistance of this conducting path.

As illustrated in FIG. 5B, the n-type source region 17, the p-type gate region 18, and the p-type embedded gate region 19 of the semiconductor device 3 extend in a direction along the p-type channel layer 14. The direction along the p-type channel layer 14 includes a direction parallel to the p-type channel layer 14 and directions substantially parallel to the p-type channel layer 14.

Pluralities of the n-type source regions 17, the p-type gate regions 18, and the p-type embedded gate regions 19 are each arranged in a direction intersecting the extending direction thereof. That is, the n-type source regions 17, the p-type gate regions 18, and the p-type embedded gate regions 19 are each arranged to have a periodic pattern in a direction intersecting the extending direction thereof. The direction intersecting the extending direction includes a direction orthogonal to the extending direction and directions substantially orthogonal to the extending direction.

The n-type column region 12 and the p-type column region 13 of the semiconductor device 3 extend in a direction along the extending direction of the n-type source region 17, the p-type gate region 18, and the p-type embedded gate region 19. The direction along the extending direction includes a direction parallel to the extending direction and directions substantially parallel to the extending direction. Pluralities of the n-type column regions 12 and the p-type column regions 13 are each arranged in a direction intersecting their own extending direction. That is, the n-type column regions 12 and the p-type column regions 13 are each arranged to have a periodic pattern in a direction intersecting the extending direction thereof.

Regions indicated by oblique lines in FIG. 5B are regions in which the p-type embedded gate regions 19 overlap the p-type column regions 13 in a top view.

According to the semiconductor device 3 of the third embodiment, the p-type embedded gate region 19 is disposed in a region of the p-type channel layer 14 electrically connected to the p-type gate region 18. As a result, the resistance of the conducting path of the large current transiently generated in the event of the turn-off can be reduced, operation of parasitic elements is suppressed, and the fracture toughness can be increased.

(First Modification)

Next, a semiconductor device of a first modification of the third embodiment will be described below using FIG. 6. In the semiconductor device of the first modification, the extending directions of an n-type column region 12a and a p-type column region 13a differ from those of the first to the third embodiments described above.

Figure 6:
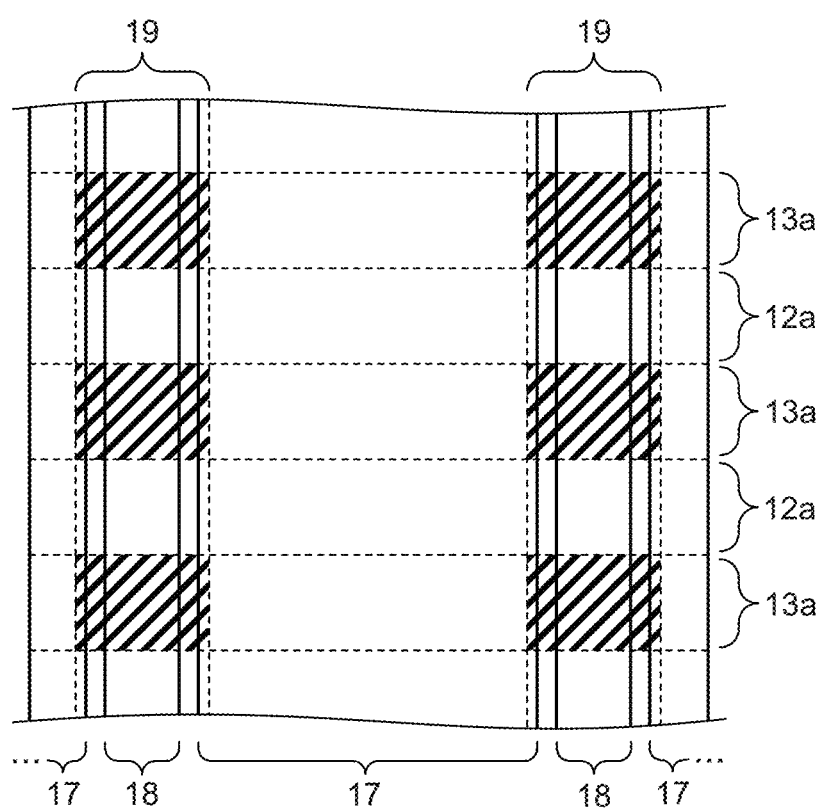
FIG. 6 is a horizontal sectional view illustrating an example of a configuration of a semiconductor device according to a first modification of the third embodiment.

FIG. 6 is a horizontal sectional view illustrating an example of a configuration of the semiconductor device according to the first modification of the third embodiment. More specifically, FIG. 6 is a horizontal sectional view of the semiconductor device of the first modification in the same position as that of line A-A of FIG. 5A.

As illustrated in FIG. 6, the n-type column region 12a and the p-type column region 13a of the semiconductor device of the first modification extend in a direction intersecting the extending direction of the n-type source region 17, the p-type gate region 18, and the p-type embedded gate region 19. Pluralities of the n-type column regions 12a and the p-type column regions 13a are each arranged in a direction intersecting their own extending direction. Regions indicated by oblique lines in FIG. 6 are regions in which the p-type embedded gate regions 19 overlap the p-type column regions 13a in the top view.

The regions in which the p-type embedded gate regions 19 overlap the p-type column regions 13a are regions that block the flow of the electrons injected from the n-type source region 17 towards the drain side in the on state. The regions in which the p-type embedded gate regions 19 overlap the p-type column regions 13a in the semiconductor device of the first modification are substantially half the regions in which the p-type embedded gate regions 19 overlap the p-type column regions 13 in the semiconductor device 3 of the third embodiment described above.

According to the semiconductor device of the first modification, the p-type embedded gate regions 19 extend in the direction along the p-type channel layer 14, and the p-type column regions 13a extend in the direction intersecting the extending direction of the p-type embedded gate regions 19. As a result, the ratio of the regions in which the p-type embedded gate regions 19 overlap the p-type column regions 13a can be reduced, and thus, the drain current can be increased in the on state.

(Second Modification)

Next, a semiconductor device 4 of a second modification of the third embodiment will be described below using FIGS. 7A and 7B. The semiconductor device 4 of the second modification differs from the semiconductor devices of the first to the third embodiments described above in that source contacts 21ca are arranged in an island pattern.

Figure 7A:
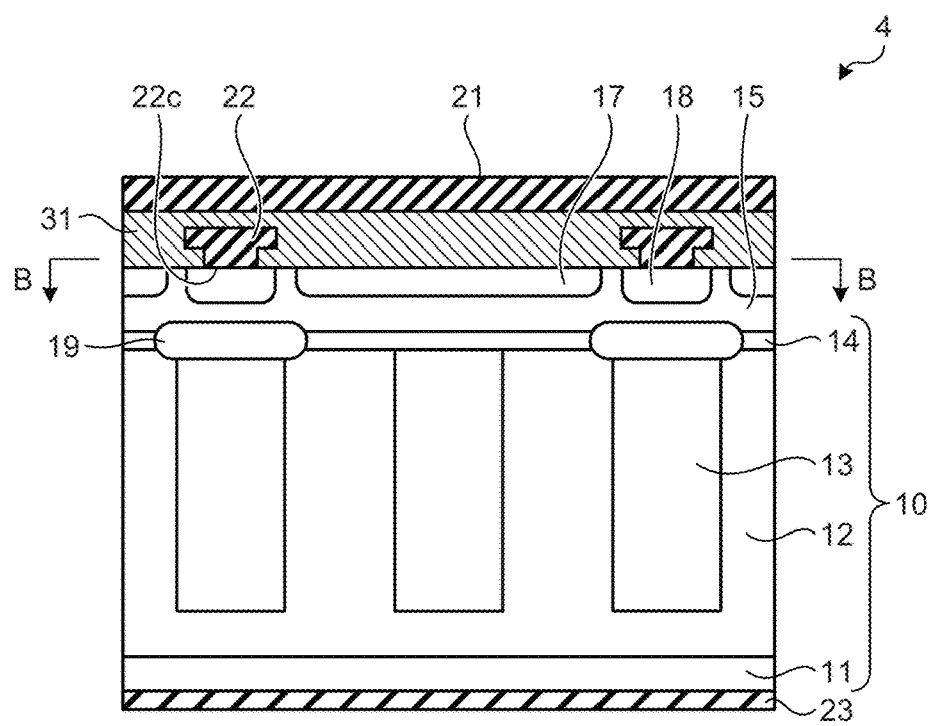
FIGS. 7A and 7B depict views illustrating an example of a configuration of a semiconductor device according to a second modification of the third embodiment.
Figure 7B:
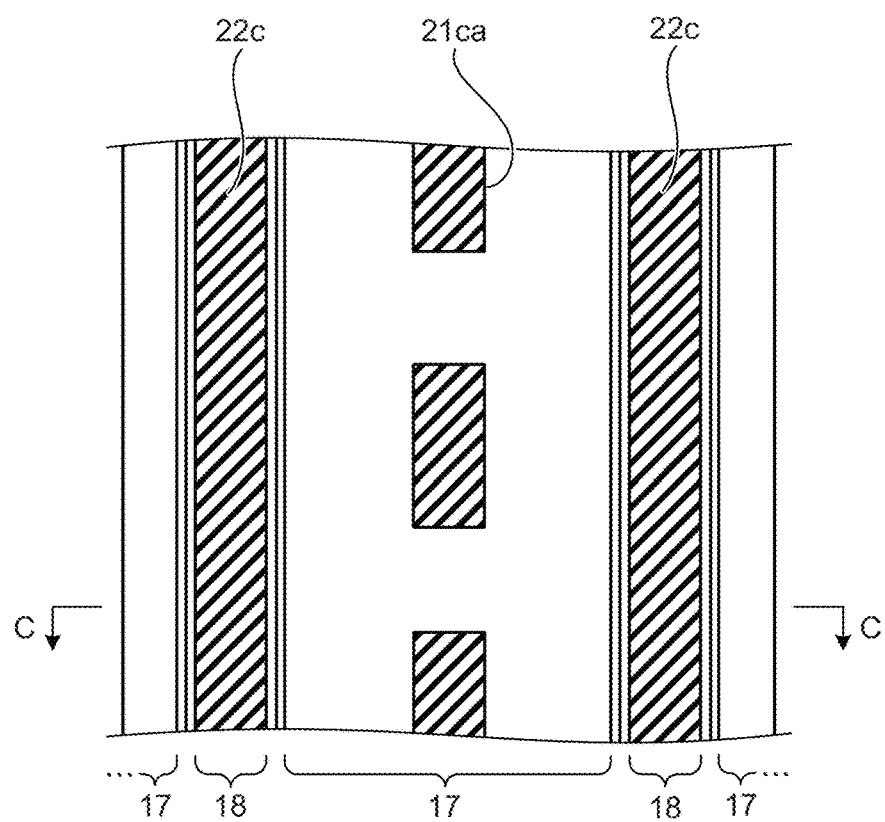

FIGS. 7A and 7B depict views illustrating an example of a configuration of the semiconductor device 4 according to the second modification of the third embodiment. FIG. 7A is a vertical sectional view of the semiconductor device 4. FIG. 7B is a horizontal sectional view of the semiconductor device 4 taken along line B-B of FIG. 7A.

As illustrated in FIG. 7B, the source contacts 21ca are separated into an island pattern, and are arranged so as to be scattered in the extending direction of the n-type source region 17.

FIG. 7A is a vertical sectional view of the semiconductor device 4 taken along line C-C of FIG. 7B, and is a vertical sectional view in a position where the source contacts 21ca are not present.

According to the semiconductor device 4 of the second modification, the source contacts 21ca are arranged so as to be scattered in the extending direction of the n-type source region 17. As a result, an effective distance from an edge of the n-type source region 17 to an edge of each of the source contacts 21ca (corresponding to the distance W4 in FIG. 1) can be further increased, and the minority carriers injected from the p-type gate region 16 into the n-type source region 17 can be reduced. Therefore, the current amplification factor in the semiconductor device 4 can be further increased.

The configuration of the semiconductor device 4 of the second modification can be usefully applied not only to the semiconductor device 3 of the third embodiment, but also to the semiconductor devices 1 and 2 of the first and the second embodiments described above.

In the first to the third embodiments and the first and the second modifications of the third embodiment described above, the n-channel transistor has been described as an example. However, the above-described configurations can be applied to a p-channel transistor obtained by inverting the conductive type of each component.

EXAMPLES

Examples will be described in detail below with reference to the drawings.

First Example

Figure 8A:
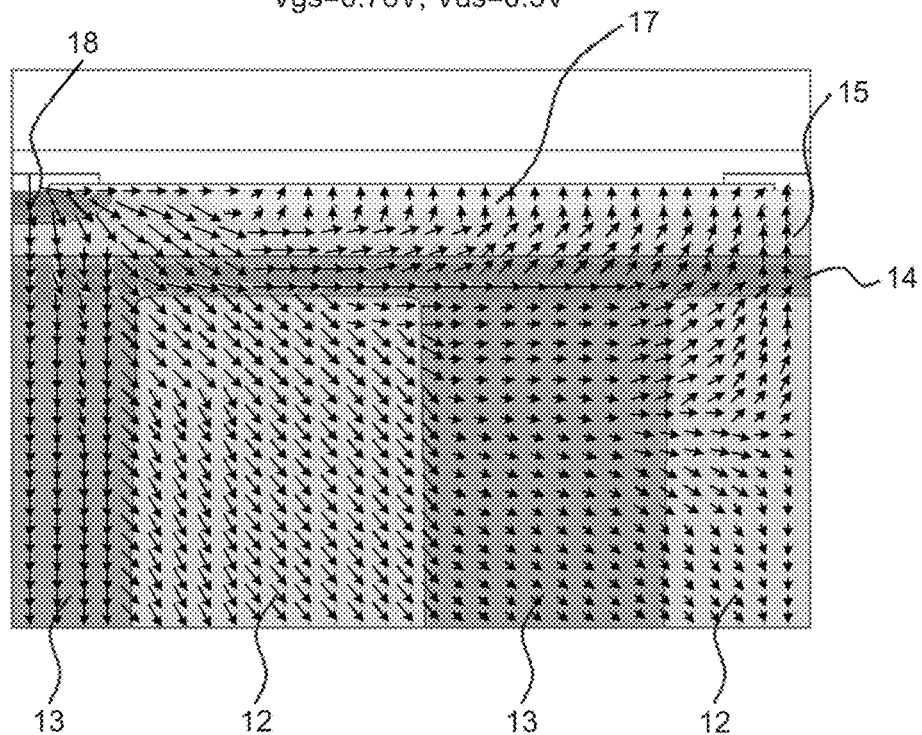
FIGS. 8A and 8B depict diagrams plotting current vectors of a semiconductor device according to a first example.
Figure 8B:
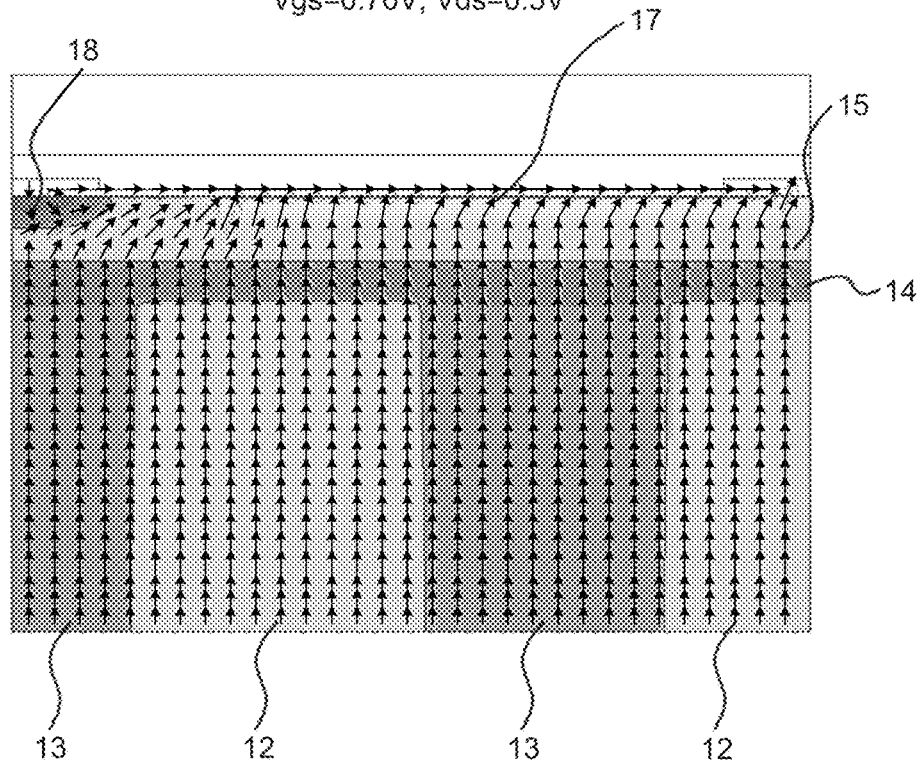

FIGS. 8A and 8B depict diagrams plotting current vectors of a semiconductor device according to a first example. FIG. 8A is a diagram plotting hole current vectors, and FIG. 8B is a diagram plotting electron current vector.

On the assumption that the semiconductor device of the first example has the same configuration as that of the semiconductor device 2 of the second embodiment, FIGS. 8A and 8B displays device simulation results of the semiconductor device of the first example in the on state so as to be enlarged in a region near the n-type source region 17, the p-type gate region 18, and the p-type channel layer 14. In FIGS. 8A and 8B, for convenience, components corresponding to the respective components of the semiconductor device 2 of the second embodiment are denoted by the same reference numerals.

In the vector representation of the hole current in FIG. 8A, the directions of the vectors represent the directions of movement of the holes. As illustrated in FIG. 8A, in the on state, the holes are injected from the p-type gate region 18 toward the n-type source region 17 and the p-type channel layer 14. The holes injected into the p-type channel layer 14 flow into the p-type column regions 13 and the n-type column regions 12.

In the vector representation of the electron current in FIG. 8B, the opposite directions of the vectors represent the direction of movement of the electrons. As illustrated in FIG. 8B, in the on state, the electrons are injected from the n-type source region 17 toward the p-type channel layer 14. The electrons injected into the p-type channel layer 14 flow into the p-type column regions 13 and the n-type column regions 12. Then, the electrons reach the drain electrode 23, and a current flows between the source electrode 21 and the drain electrode 23.

From the simulation results of FIGS. 8A and 8B, the behavior of the holes and the electrons in the region near the n-type source region 17, the p-type gate region 18, and the p-type channel layer 14 is understood, and the operations of, for example, the semiconductor devices 1 to 3 and 4 of the first to the third embodiments and the first and the second modifications thereof described above are confirmed.

Second Example

Next, a semiconductor device of a second example will be described below using FIGS. 9 and 10.

Figure 9:
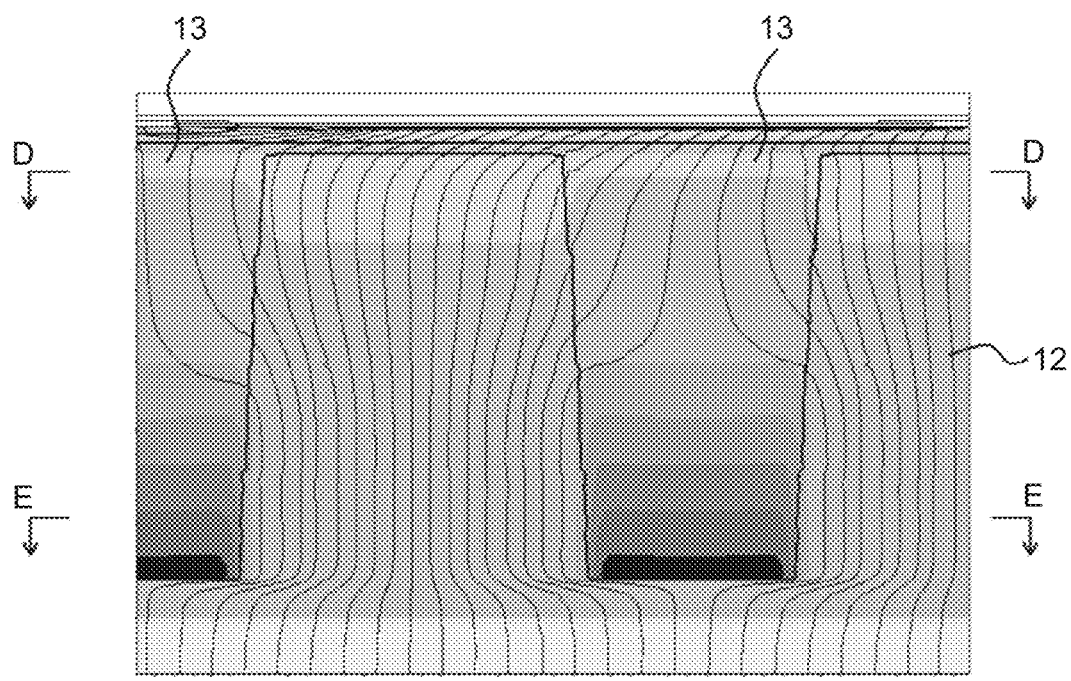
FIG. 9 is an electron density contour plot and a current line plot of a semiconductor device according to a second example.

FIG. 9 is an electron density contour plot and a current line plot of the semiconductor device according to the second example. In FIG. 9, the electron density contour plot and the current line plot are displayed so as to overlap each other. In FIG. 9, the electron density is indicated to be higher as the color is lighter.

On the assumption that the semiconductor device of the second example has the same configuration as that of the semiconductor device 2 of the second embodiment, FIG. 9 displays device simulation results of the semiconductor device of the second example in the on state so as to be enlarged in a region near the n-type column regions 12 and the p-type column regions 13. In FIG. 9, for convenience, components corresponding to the respective components of the semiconductor device 2 of the second embodiment are denoted by the same reference numerals.

Figure 10A:
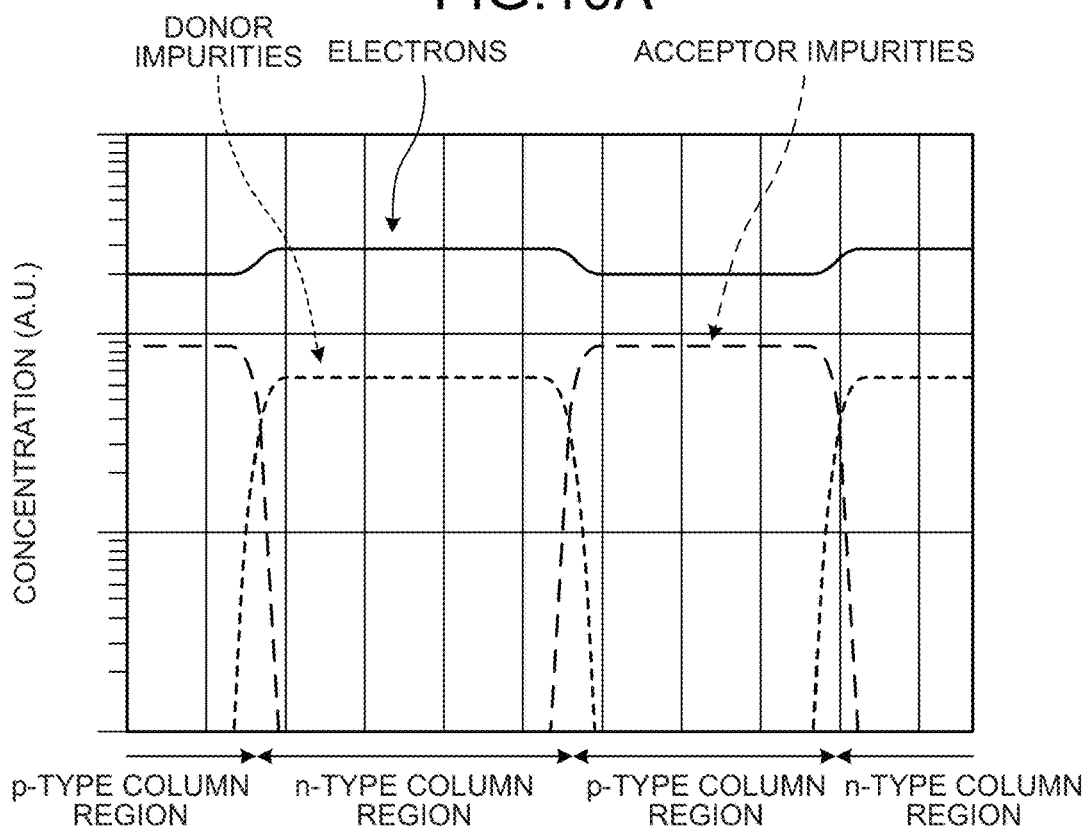
FIGS. 10A and 10B depict graphs each illustrating a concentration of donor impurities, a concentration of acceptor impurities, and an electron density of the semiconductor device according to the second example.
Figure 10B:
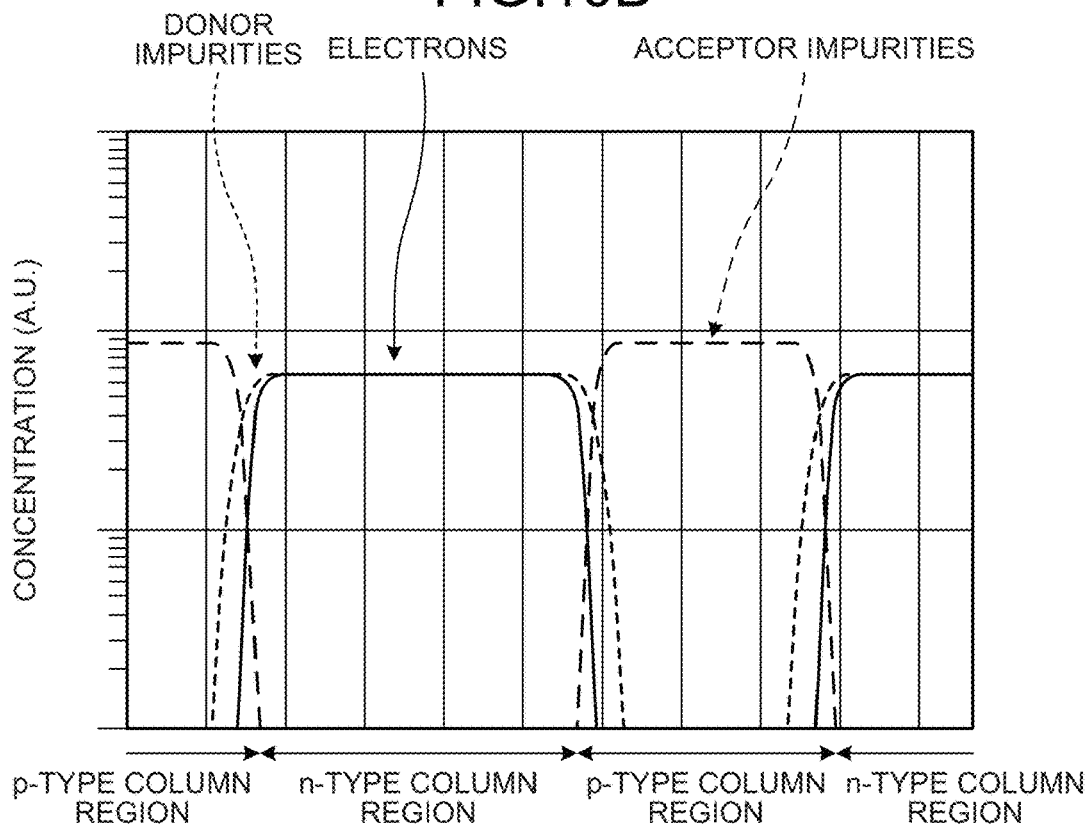

FIGS. 10A and 10B depict graphs each illustrating a concentration of donor impurities, a concentration of acceptor impurities, and the electron density of the semiconductor device according to the second example. FIG. 10A is a graph in a depth position indicated by line D-D of FIG. 9, and FIG. 10B is a graph in a depth position indicated by line E-E of FIG. 9. The concentration of the donor impurities, the concentration of the acceptor impurities, and the electron density illustrated in FIGS. 10A and 10B are also based on the simulation.

As illustrated in FIGS. 9, 10A, and 10B, the electron density increases in an upper portion of the super junction structure. This is because the holes are injected from the p-type gate region 16 into the n-type column regions 12 and the p-type column regions 13 through the p-type channel layer 14 as described above, and a charge neutral condition is made to be maintained. As illustrated by the current line plot of FIG. 9, the electron current spreads in both the n-type column regions 12 and the p-type column regions 13.

As illustrated in FIGS. 9, 10A, and 10B, the electron density decreases in a lower portion of the super junction structure. The electron density is substantially equal to the concentration of the donor impurities in the n-type column regions 12, and is lower than the concentration of the acceptor impurities in the p-type column regions 13. This is because the holes injected into the n-type column regions 12 and the p-type column regions 13 gradually decrease as they move downward in the super junction structure. As a result, the conductivity modulation effect decreases in the lower portion of the super junction structure, and the electron current flows exclusively in the n-type column regions 12 as illustrated in the current line plot of FIG. 9.

As described above, in the semiconductor device of the second example, mainly the upper portion of the super junction structure is reduced in resistance by the conductivity modulation in the on state.

Third Example

Figure 11:
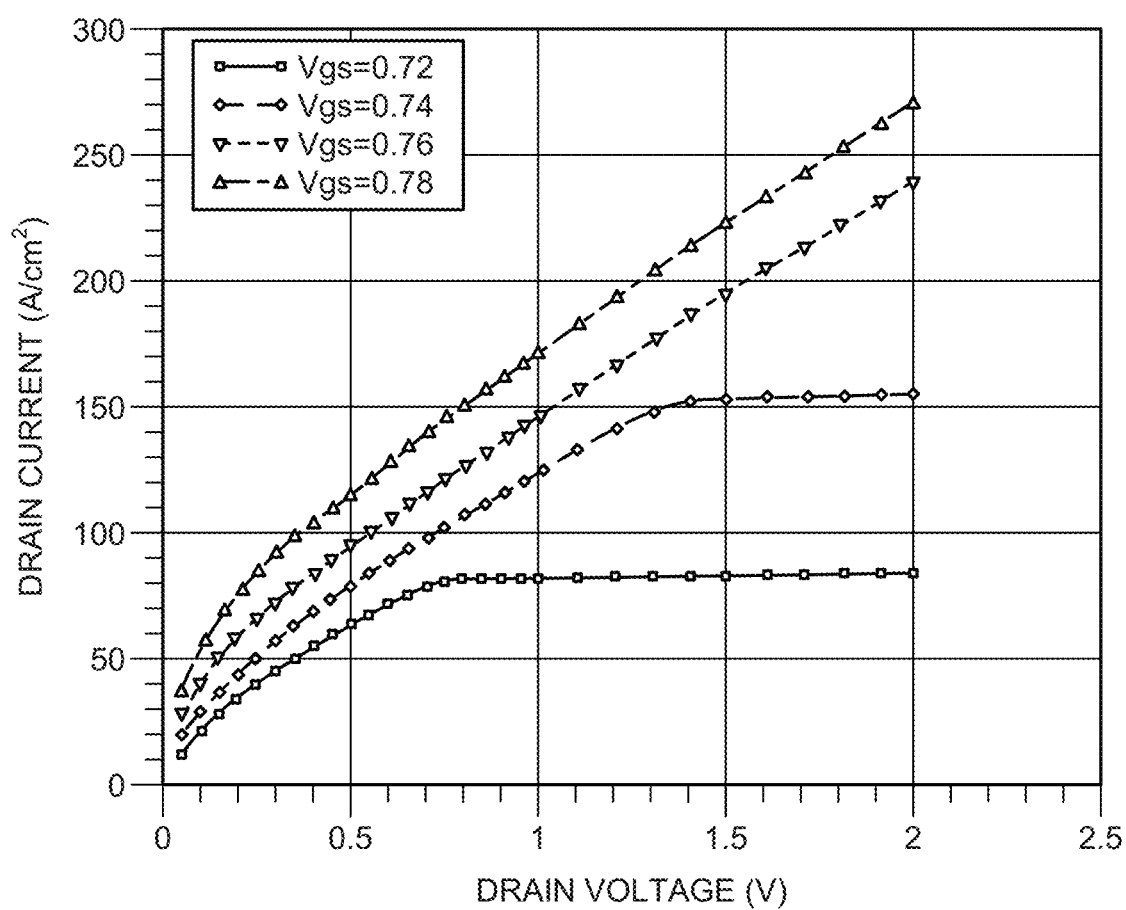
FIG. 11 is a graph illustrating electrical characteristics of a semiconductor device according to a third example.

Next, a semiconductor device of a third example will be described below using FIG. 11. FIG. 11 is a graph illustrating electrical characteristics of the semiconductor device according to the third example.

On the assumption that the semiconductor device of the third example has the same configuration as that of the semiconductor device 2 of the second embodiment, FIG. 11 plots device simulation results of the semiconductor device of the third example.

As illustrated in FIG. 11, the semiconductor device of the third example is predicted to exhibit a steep rise of the drain current in a saturation region, and have good electrical characteristics.

Fourth Example

Figure 12:
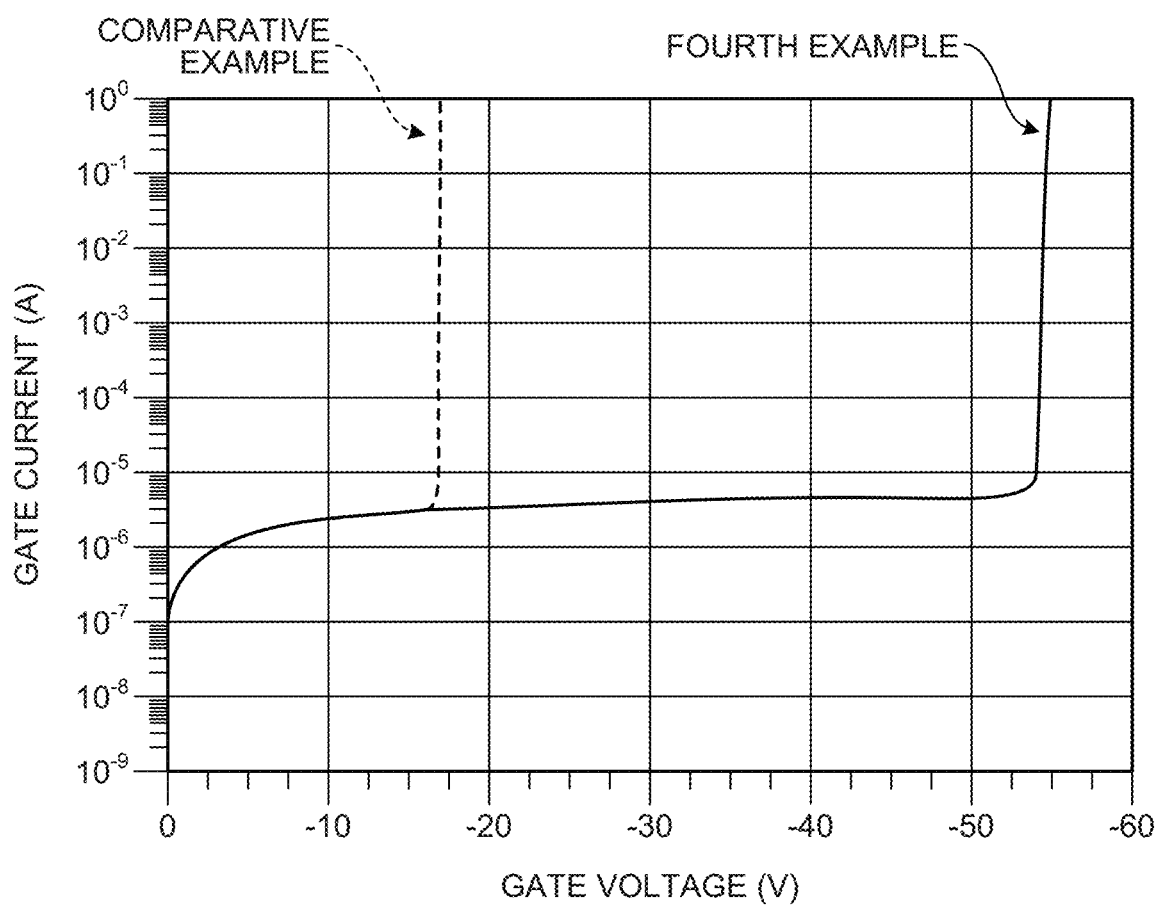
FIG. 12 is a graph illustrating withstand voltage characteristics of semiconductor devices according to a fourth example and the comparative example.

Next, a semiconductor device of a fourth example will be described below using FIG. 12. FIG. 12 is a graph illustrating withstand voltage characteristics of the semiconductor devices according to the fourth example and the comparative example.

The semiconductor device of the fourth example is assumed to have the same configuration as that of the semiconductor device 2 of the second embodiment. The semiconductor device of the comparative example is the semiconductor device illustrated in FIG. 3 described above. The withstand voltage obtained when a reverse bias is applied to the gate electrode and the source electrode of each of these semiconductor devices was simulated.

As illustrated in FIG. 12, the withstand voltage of the semiconductor device of the comparative example was lower than 20 V, whereas the withstand voltage of the semiconductor device of the fourth example was 50 V or higher.

Fifth Example

Next, a semiconductor device of a fifth example will be described below using FIG. 13.

Figure 13:
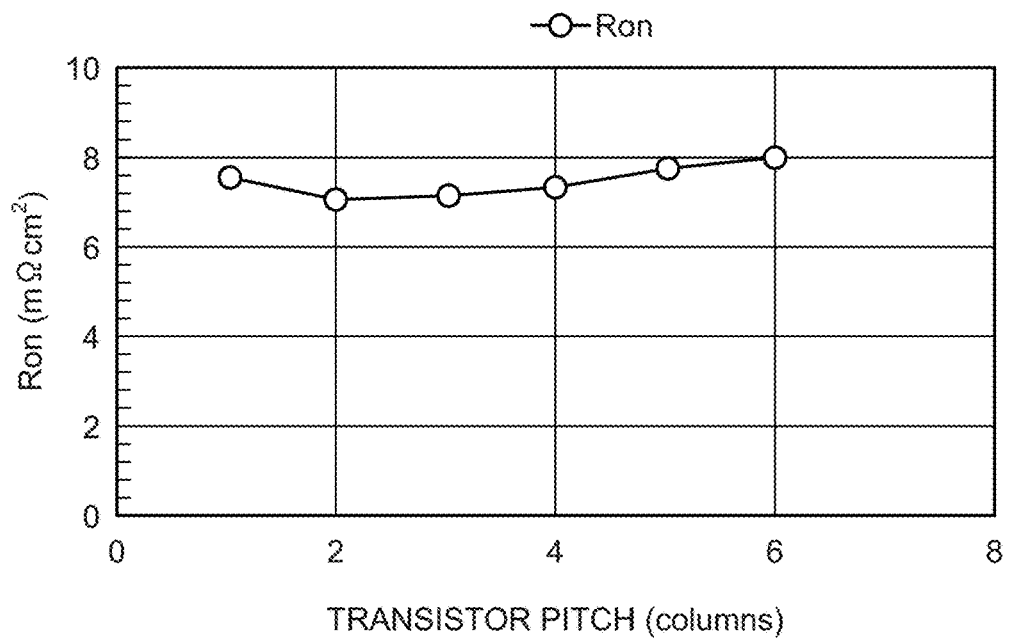
FIG. 13 is a graph illustrating dependence of an on-resistance on a transistor pitch in a semiconductor device according to a fifth example.

FIG. 13 is a graph illustrating dependence of an on-resistance Ron on the transistor pitch in the semiconductor device according to the fifth example. The horizontal axis of the graph of FIG. 13 indicates the transistor pitch by the number of the p-type column regions included between the transistors. That is, in the case of the semiconductor device 1 of the first embodiment illustrated in FIG. 1, the number of the p-type column regions 13 included between the transistors is two, so that the transistor pitch is two.

On the assumption that the semiconductor device of the fifth example has the same configuration as that of the semiconductor device 2 of the second embodiment, FIG. 13 plots the device simulation results by changing the transistor pitch of the semiconductor device of the fifth example. More specifically, in FIG. 13, the width of the n-type source region was changed, and the transistor pitch was changed accordingly. At this time, the pitch of the super junction structure was kept fixed.

As illustrated in FIG. 13, in the semiconductor device of the fifth example, the on-resistance Ron decreases once as the transistor pitch increases. This is because, as described above, the increase in the width of the n-type source region increases the number of the electrons injected from the n-type source region into the p-type channel layer.

Further, in the semiconductor device of the fifth embodiment, the on-resistance Ron having once decreased increases again as the transistor pitch increases. This is because, as described above, the increase in the width of the n-type source region increases the moving distance of the holes in the n-type source region and the p-type channel layer, and thus, increases the source resistance and the channel resistance.

The above-described results prove that the transistor pitch has an optimum value, and the on-resistance can be reduced by optimizing the width of the n-type source region.

Sixth Example

Figure 14:
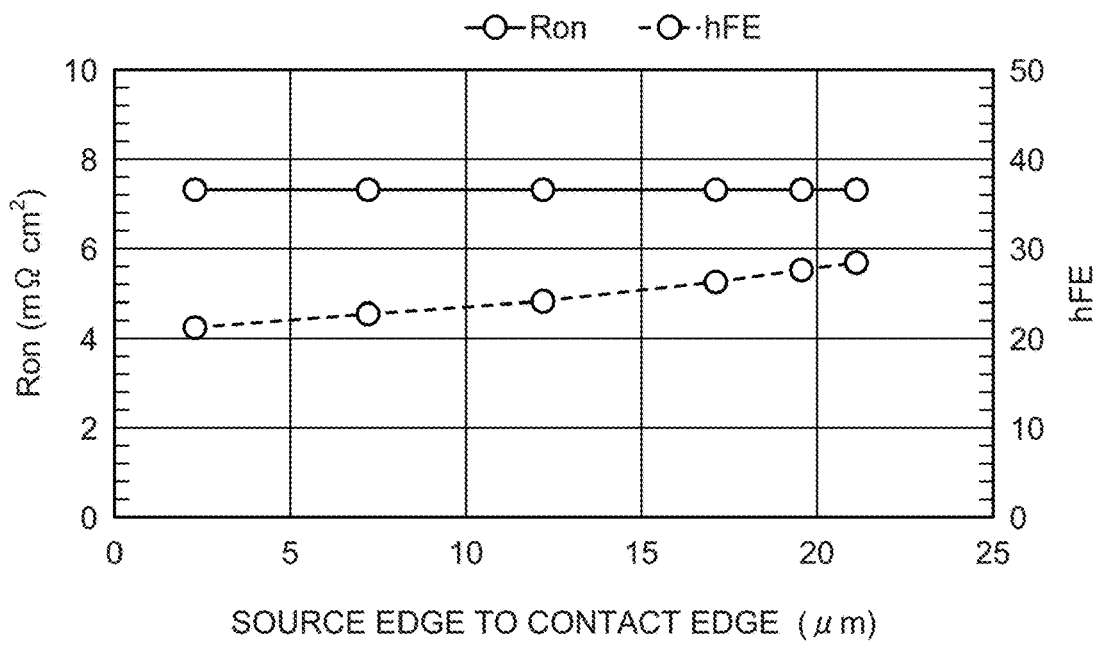
FIG. 14 is a graph illustrating dependence of the on-resistance and a current amplification factor on a distance from an n-type source region edge to a source contact edge in a semiconductor device according to a sixth example.

Next, a semiconductor device of a sixth example will be described below using FIG. 14. FIG. 14 is a graph illustrating dependence of the on-resistance Ron and a current amplification factor hFE on the distance from the n-type source region edge to the source contact edge in the semiconductor device according to the sixth example.

On the assumption that the semiconductor device of the sixth example has the same configuration as that of the semiconductor device 2 of the second embodiment, FIG. 14 plots the device simulation results by changing the distance from the edge of the n-type source region to the edge of the source contact (corresponding to the distance W4 in FIG. 1) of the semiconductor device of the sixth example.

As illustrated in FIG. 14, in the semiconductor device of the sixth example, the current amplification factor hFE (=drain current/gate current) increases as the distance from the edge of the n-type source region to the edge of the source contact increases. This is because, as the distance from the edge of the n-type source region to the edge of the source contact increases, the current caused by the holes injected from the p-type gate region into the n-type source region decreases, and therefore, the gate current decreases. In contrast, changing the distance from the edge of the n-type source region to the edge of the source contact has little effect on the on-resistance Ron.

The above-described results prove that increasing the distance from the edge of the n-type source region to the edge of the source contact can increase the current amplification factor without increasing the on-resistance.

According to an embodiment of the present invention, a semiconductor device that has high withstand voltage characteristics and is capable of suppressing breakage due to a large transient current can be obtained.

While some embodiments of the present invention have been described, these embodiments have been presented as examples, and are not intended to limit the scope of the invention. These novel embodiments can be implemented in various other forms, and various omissions, replacements, and modifications can be made without departing from the gist of the invention. These embodiments and modifications thereof are included in the scope and the gist of the invention, and are included in the invention described in the claims and the equivalent scope thereof.

The invention claimed is:

1. A semiconductor device including a super junction structure including a first column region of a first conductive type and a second column region of a second conductive type disposed adjacent to the first column region, the semiconductor device further including: first and second electrodes that are disposed on one side of the super junction structure and that constitute a transistor and are configured to control a current flowing in the transistor; and a third electrode that is disposed on an opposite side of the first and the second electrodes with the super junction structure interposed therebetween and that constitutes the transistor, the semiconductor device comprising:
    a first semiconductor layer of the second conductive type disposed on the first column region and the second column region;
    a second semiconductor layer of the first conductive type disposed on the first semiconductor layer;
    a first semiconductor region of the first conductive type that is a semiconductor region electrically connected to the first electrode, the first semiconductor region being disposed in a surface layer portion of the second semiconductor layer to be separated from the first semiconductor layer; and
    a second semiconductor region of the second conductive type that is a semiconductor region electrically connected to the second electrode, the second semiconductor region being disposed at least in the surface layer portion of the second semiconductor layer to be separated from the first semiconductor region and being electrically connected to the first semiconductor layer.

2. The semiconductor device according to claim 1, wherein the second semiconductor region is not in contact with the first semiconductor layer.

3. The semiconductor device according to claim 1, comprising a third semiconductor region of the second conductive type that is disposed in a region of the first semiconductor layer electrically connected to the second semiconductor region.

4. The semiconductor device according to claim 3, wherein
   the third semiconductor region extends in a first direction along the first semiconductor layer, and
   the first column region and the second column region are arranged in the first direction and extend in a second direction intersecting the first direction.

5. The semiconductor device according to claim 1, comprising contacts via which the first semiconductor region is connected to the first electrode, the contacts being disposed on the first semiconductor region, wherein
   the first semiconductor region extends in a third direction along the first semiconductor layer, and
   the contacts are arranged to be scattered in the third direction.

\* \* \* \* \*